United States Patent
Gerl et al.

(10) Patent No.: US 11,916,570 B1
(45) Date of Patent: Feb. 27, 2024

(54) CODEWORD FORMAT FOR DATA STORAGE

(71) Applicant: TEXAS INSTRUMENTS INCORPORATED, Dallas, TX (US)

(72) Inventors: Dominik Stefan Gerl, Buch am Erlbach (DE); Annabelle Arnold, Zolling (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/985,361

(22) Filed: Nov. 11, 2022

(51) Int. Cl.
*H03M 13/00* (2006.01)
*H03M 13/09* (2006.01)

(52) U.S. Cl.
CPC ....... *H03M 13/098* (2013.01); *H03M 13/611* (2013.01)

(58) Field of Classification Search
CPC ............. H03M 13/098; H03M 13/635; H03M 13/151; H03M 13/47; H03M 13/611; H03M 13/6343
See application file for complete search history.

(56) References Cited

U.S. PATENT DOCUMENTS

| | | | | |
|---|---|---|---|---|
| 7,565,597 B1 * | 7/2009 | Branth | ................ | G06F 11/1032 714/763 |
| 8,627,165 B2 * | 1/2014 | Liikanen | ............ | H03M 13/253 714/752 |
| 8,874,994 B2 * | 10/2014 | Sharon | ................. | G11C 7/1006 714/766 |
| 8,972,835 B1 * | 3/2015 | Rahul | ................... | H03M 13/19 714/800 |
| 9,582,354 B2 * | 2/2017 | Kern | ................... | G06F 11/1012 |
| 10,289,486 B2 * | 5/2019 | Ryu | ..................... | G06F 11/1068 |
| 2009/0013223 A1 * | 1/2009 | Lam | ..................... | G06F 11/1072 714/701 |

* cited by examiner

*Primary Examiner* — Esaw T Abraham
(74) *Attorney, Agent, or Firm* — Andrew R. Ralston; Frank D. Cimino

(57) ABSTRACT

The present disclosure generally relates to a codeword format for data storage and to methods and circuits for generating a codeword based on data to be written in memory and extracting data from a codeword read from memory. In an example, an integrated circuit includes a memory system and a controller circuit. The controller circuit is communicatively coupled to the memory system and is configured to: receive multi-bit data; generate a codeword based on the multi-bit data; and transmit to the memory system the codeword for writing to memory. The codeword has a format that includes first bit positions for the multi-bit data, second bit positions for a bitwise inversion of the multi-bit data, a third bit position for an odd parity value, and a fourth bit position for an even parity value. The odd and even parity values indicate an odd and even parity, respectively, of the multi-bit data.

33 Claims, 6 Drawing Sheets

CODEWORD FORMAT FOR DATA STORAGE

BACKGROUND

Many memory technologies are generally configured to store data interpreted from high or low charges or voltages. A memory cell in many memory technologies generally includes a circuit configured to store one bit of data, that is, to store one high or low charge or voltage in a bitcell. Over the lifetime of the memory, errors can occur such that a high or low charge or voltage is stored in the bitcell that incorrectly represents the data that was stored in the memory. These errors can be caused by events during a write operation (such that an incorrect charge or voltage being stored initially by the write operation) or subsequent to a write operation (such that the charge or voltage stored is changed to an incorrect charge or voltage).

SUMMARY

This Summary is provided to introduce a brief selection of disclosed concepts in a simplified form that are further described below in the Detailed Description including the drawings provided. Various disclosed devices and methods may be beneficially applied in the context of writing to and/or reading from memory in an integrated circuit (IC) die. While such examples may be expected to increase instances in which errors in data written in memory may be detected and/or corrected, no particular result is a requirement unless explicitly recited in a particular claim.

An example described herein is an integrated circuit. The integrated circuit includes a memory system and a controller circuit. The memory system includes memory. The controller circuit includes one or more logic circuits. The controller circuit is communicatively coupled to the memory system. The controller circuit is configured to: receive multi-bit data to be written to the memory; generate a codeword based on the multi-bit data; and transmit to the memory system the codeword for writing to the memory. The codeword has a format that includes first bit positions for the multi-bit data, second bit positions for a bitwise inversion of the multi-bit data, a third bit position for an odd parity value, and a fourth bit position for an even parity value. The odd parity value indicates an odd parity of the multi-bit data, and the even parity value indicates an even parity of the multi-bit data.

Another example described herein is an integrated circuit. The integrated circuit includes a memory system and a controller circuit. The memory system includes memory. The controller circuit includes one or more logic circuits. The controller circuit is communicatively coupled to the memory system. The controller circuit is configured to: receive from the memory system a codeword read from the memory. The codeword has a format that includes first bit positions corresponding to multi-bit data, second bit positions corresponding to a bitwise inversion of the multi-bit data, a third bit position corresponding to a first parity value of the multi-bit data, and a fourth bit position corresponding to a second parity value of the multi-bit data. The first parity value is one of an even parity value or an odd parity value, and the second parity value is the other of the even parity value or the odd parity value. The controller circuit is further configured to: determine a number of counted bit errors in the codeword. A counted bit error includes a bit value of a bit position of the first bit positions and a bit value of a corresponding bit position of the second bit positions having an equal value and includes a bit value of the third bit position and a bit value of the fourth bit position having an equal value. The controller circuit is further configured to: determine a third parity value of bit values of the first bit positions, and determine a fourth parity value of bit values of the second bit positions. The third parity value is a same parity type as the first parity value. The controller circuit is further configured to: transmit the bit values of the first bit positions as the multi-bit data read from the memory on the condition that (i) the number of counted bit errors is equal to or less than one and (ii) the third parity value is equal to a bit value of the third bit position. The controller circuit is further configured to: transmit a bitwise inversion of the bit values of the second bit positions as the multi-bit data read from the memory on the condition that (i) the number of counted bit errors is equal to or less than one, (ii) the third parity value is not equal to the bit value of the third bit position, and (iii) the fourth parity value is equal to a bit value of the fourth bit position.

A further example described herein is a method of manufacturing an integrated circuit (IC). A memory system is formed on or over a semiconductor substrate. The memory system includes memory. A controller circuit is formed on or over the semiconductor substrate. The controller circuit includes one or more logic circuits. The controller circuit is communicatively coupled to the memory system. The controller circuit is configured to: receive multi-bit data to be written to the memory; generate a codeword based on the multi-bit data; and transmit to the memory system the codeword for writing to the memory. The codeword has a format that includes first bit positions for the multi-bit data, second bit positions for a bitwise inversion of the multi-bit data, a third bit position for an odd parity value, and a fourth bit position for an even parity value. The odd parity value indicates an odd parity of the multi-bit data, and the even parity value indicates an even parity of the multi-bit data.

Another example described herein is a method of manufacturing an integrated circuit. A memory system is formed on or over a semiconductor substrate. The memory system includes memory. A controller circuit is formed on or over the semiconductor substrate. The controller circuit includes one or more logic circuits. The controller circuit is communicatively coupled to the memory system. The controller circuit is configured to: receive from the memory system a codeword read from the memory. The codeword has a format that includes first bit positions corresponding to multi-bit data, second bit positions corresponding to a bitwise inversion of the multi-bit data, a third bit position corresponding to a first parity value of the multi-bit data, and a fourth bit position corresponding to a second parity value of the multi-bit data. The first parity value is one of an even parity value or an odd parity value, and the second parity value is the other of the even parity value or the odd parity value. The controller circuit is further configured to: determine a number of counted bit errors in the codeword. A counted bit error includes a bit value of a bit position of the first bit positions and a bit value of a corresponding bit position of the second bit positions having an equal value and includes a bit value of the third bit position and a bit value of the fourth bit position having an equal value. The controller circuit is further configured to: determine a third parity value of bit values of the first bit positions, and determine a fourth parity value of bit values of the second bit positions. The third parity value is a same parity type as the first parity value. The controller circuit is further configured to: transmit the bit values of the first bit positions as the multi-bit data read from the memory on the condition that (i) the number of counted bit errors is equal to or less than one and (ii) the third parity value is equal to a bit value of the third bit position. The controller circuit is further configured to: transmit a bitwise inversion of the bit values of the second bit positions as the multi-bit data read from the memory on the condition that (i) the number of counted bit errors is equal to or less than one, (ii) the third parity value is not equal to the bit value of the third bit position, and (iii) the fourth parity value is equal to a bit value of the fourth bit position.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
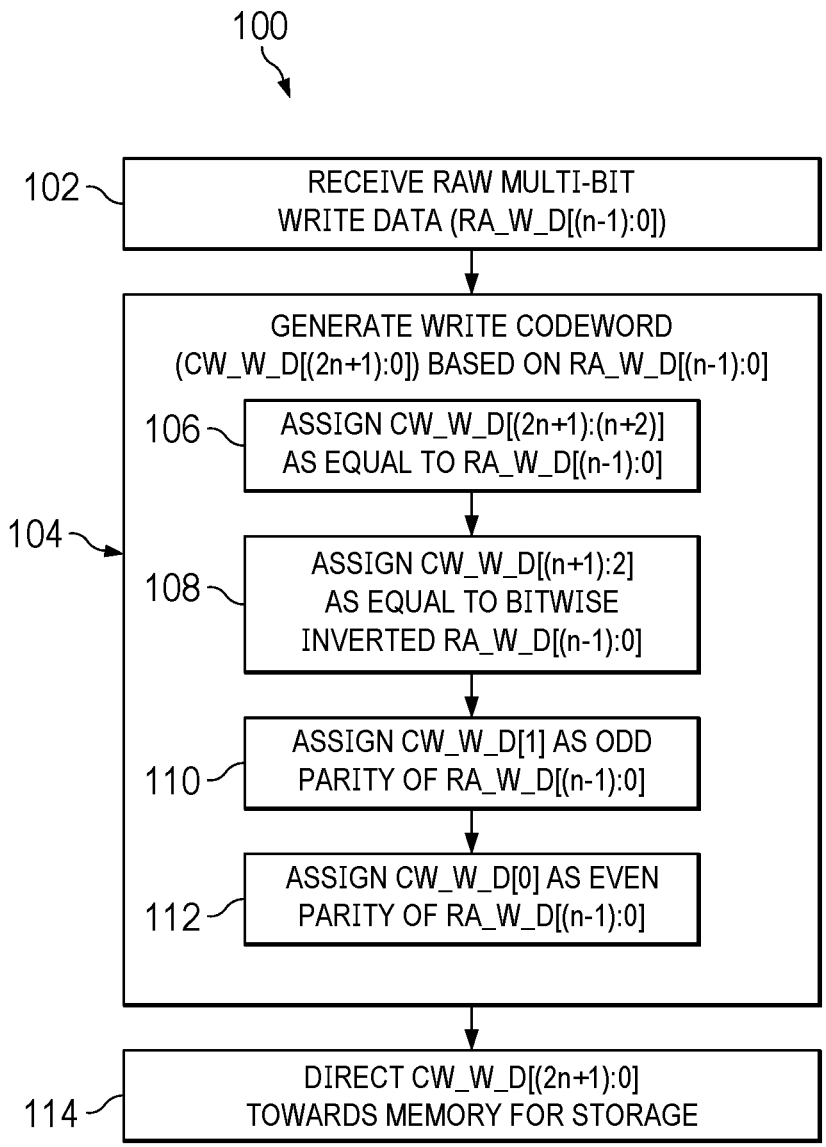
FIG. 1 is a flowchart of a method of generating a codeword based on multi-bit data to be written to memory according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Various disclosed methods and devices of the present disclosure may be beneficially applied to memory circuits or subsystems that store data in an integrated circuit for various purposes. Such examples may decrease sensitivity of such memory implantations to potential data corruption due to e.g., manufacturing variation or radiation effects. While such embodiments may be expected to provide improvements in performance, utility or reliability of such devices, no particular result is a requirement of the present invention unless explicitly recited in a particular claim.

The present disclosure relates to a codeword format for data storage and to methods and circuits for generating a codeword based on data to be written in memory and extracting data from a codeword read from memory. A write or read codeword (CW_x_D, where x is W for write or R for read) according to some examples has a format that includes a first subset (e.g., a proper subset) of bit positions, a second subset (e.g., a proper subset) of bit positions, an odd parity bit position, and an even parity bit position. In some examples, the first subset of bit positions stores multi-bit data, and the second subset of bit positions stores a bitwise inversion of the multi-bit data. The odd parity bit position stores an odd parity value derived from the multi-bit data, and the even parity bit position stores an even parity value derived from the multi-bit data. For purposes of illustration, the first subset are the most significant bit positions in the codeword (CW_x_D) and are concatenated with the second subset, which are the next most significant bit positions in the codeword (CW_x_D). The odd parity bit position and even parity bit position may be the least two significant bit positions in the codeword (CW_x_D). The first subset and the second subset both have a number n of bit positions, where n may be an even number or an odd number. Hence, the codeword (CW_x_D) has (2n+2) number of bit positions. Table 1 below illustrates this format of the codeword (CW_x_D). Other formats may be implemented in other examples. Methods and circuits implementing such a format can achieve increased error detection and/or correction. Other advantages and benefits may be achieved in various examples.

TABLE 1

| Position | 2n + 1 | 2n | ... | n + 2 | n + 1 | n | ... | 2 | 1 | 0 |
|---|---|---|---|---|---|---|---|---|---|---|
| Subset | First Subset | | | | Second Subset | | | | Odd | Even |

FIG. 1 is a flowchart of a method 100 of generating a codeword based on multi-bit data to be written to memory according to some examples. The method 100 of FIG. 1 assumes that multi-bit write data has a number n of bit positions, and is described in the context of a write codeword (CW_W_D) having a format as indicated in Table 1. The n bit positions may be an even number or an odd number in examples. Other formats of a write codeword can be implemented, and modifications to the method 100 of FIG. 1 based on such other formats would be apparent. The method 100 of FIG. 1 may be performed by an encoder/decoder controller circuit, as detailed subsequently.

At block 102, raw multi-bit write data (RA_W_D[(n−1):0]) is received. The multi-bit write data (RA_W_D[(n−1):0]) represents data that is to be written to memory. At block 104, a write codeword (CW_W_D[(2n+1):0]) is generated based on the multi-bit write data (RA_W_D[(n−1):0]). Block 104 includes blocks 106, 108, 110, 112 that assign respective bit values to bit positions of the write codeword (CW_W_D [(2n+1):0]). At block 114, the write codeword (CW_W_D [(2n+1):0]) is directed towards a memory for storage.

Table 2 below summarizes how bit values of bit positions of the write codeword (CW_W_D[(2n+1):0]) are assigned in blocks 106-112.

TABLE 2

| | | CW_W_D | | |
|---|---|---|---|---|
| Position | 2n + 1 | ... | n + 2 | |
| Value | RA_W_D[n − 1] | ... | RA_W_D[0] | |
| Position | n + 1 | ... | 2 | |
| Value | NOT(RA_W_D[n − 1]) | ... | NOT(RA_W_D[0]) | |
| Position | 1 | | 0 | |
| Value | Odd Parity (RA_W_D[(n − 1):0]) | | Even Parity (RA_W_D[(n − 1):0]) | |

Referring back to block 104, at block 106, bit values of the first subset of bit positions (CW_W_D[(2n+1):(n+2)]) are assigned as equal to bit values of corresponding bit positions of the multi-bit write data (RA_W_D[(n−1):0]). At block 108, bit values of the second subset of bit positions (CW_W_D[(n+1):2]) are assigned as equal to bitwise inverted bit values of corresponding bit positions of the multi-bit write data (RA_W_D[(n−1):0]). At block 110, a bit value of the odd parity bit position (CW_W_D[1]) is assigned as the value of an odd parity result of the multi-bit write data (RA_W_D[(n−1):0]). At block 112, a bit value of the even parity bit position (CW_W_D[0]) is assigned as the value of an even parity result of the multi-bit write data (RA_W_D[(n−1):0]).

Generally, in this example, a result of an odd parity may be considered the value (e.g., logical zero or logical one) to be added to the number of logical ones contained in the bit values of the multi-bit write data (RA_W_D[(n−1):0]) to obtain an odd number of logical ones. For example, if RA_W_D[3:0]='0110', the result of an odd parity is a logical one. Generally, in this example, a result of an even parity may be considered the value (e.g., logical zero or logical one) to be added to the number of logical ones contained in the bit values of the multi-bit write data (RA_W_D[(n−1):0]) to obtain an even number of logical ones. For example, if RA_W_D[3:0]='0110', the result of an even parity is a logical zero. The results of the odd parity and even parity of the same multi-bit write data (RA_W_D[(n−1):0]) may be logical inversions of each other. Hence, in such situations, one parity (e.g., even or odd) may be calculated for a value of a bit position of that parity type, and a logical inversion of that calculated value may be assigned to the bit position of the other parity type.

Table 3 below summarizes an example in which n is equal to four, such that the multi-bit write data (RA_W_D) has four bit positions and the write codeword (CW_W_D) has ten bit positions.

TABLE 3

| | | CW_W_D | | |
|---|---|---|---|---|
| Pos. | 9 | 8 | 7 | 6 |
| Val. | RA_W_D[3] | RA_W_D[2] | RA_W_D[1] | RA_W_D[0] |
| Pos. | 5 | 4 | 3 | 2 |
| Val. | NOT(RA_W_D[3]) | NOT(RA_W_D[2]) | NOT(RA_W_D[1]) | NOT(RA_W_D[0]) |
| Pos. | 1 | | 0 | |
| Val. | Odd Parity (RA_W_D[3:0]) | | Even Parity (RA_W_D[3:0]) | |

Figure 2A:
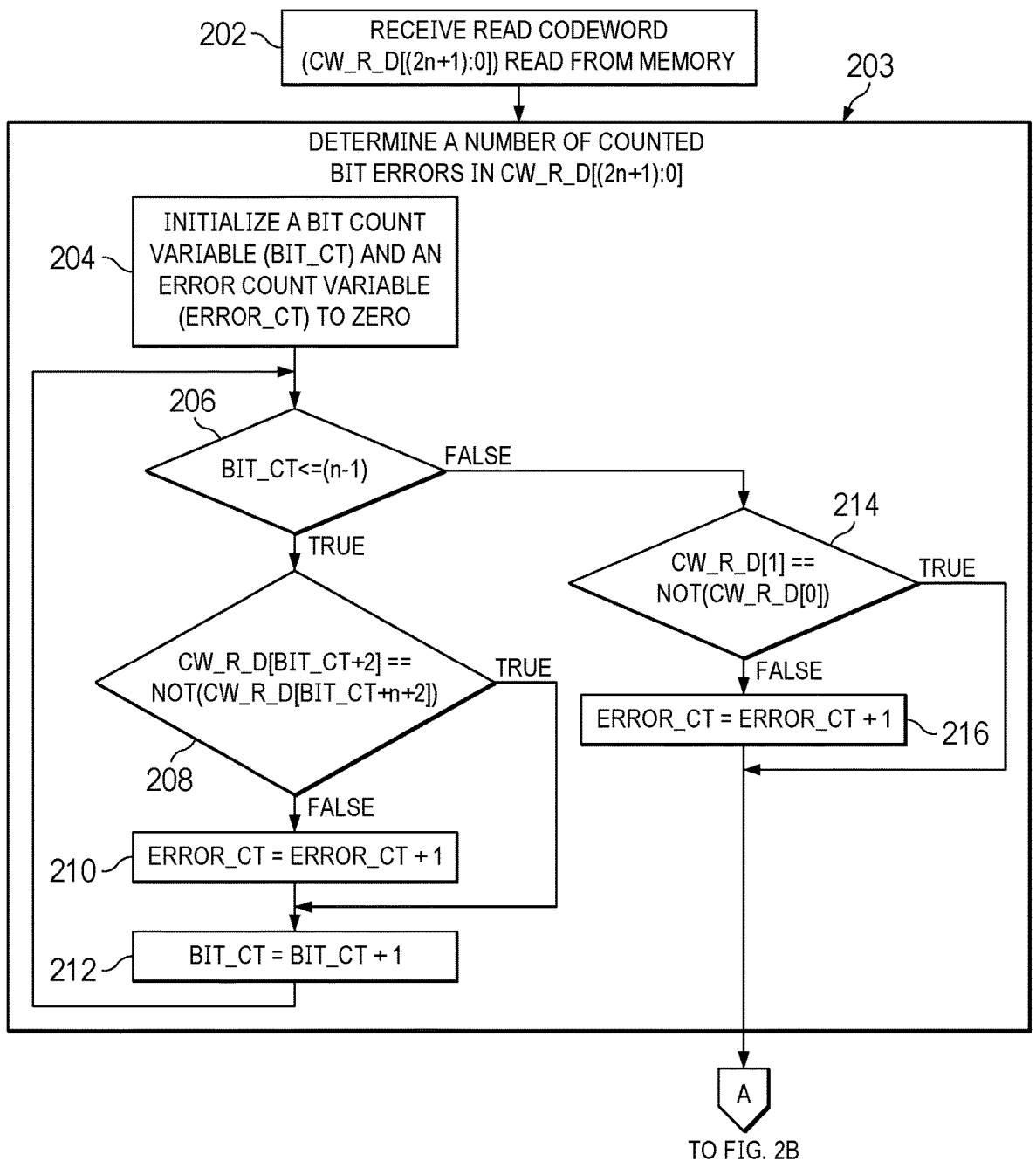
FIGS. 2A and 2B are flowcharts of a method of extracting multi-bit data from a codeword read from memory according to some examples.
Figure 2B:
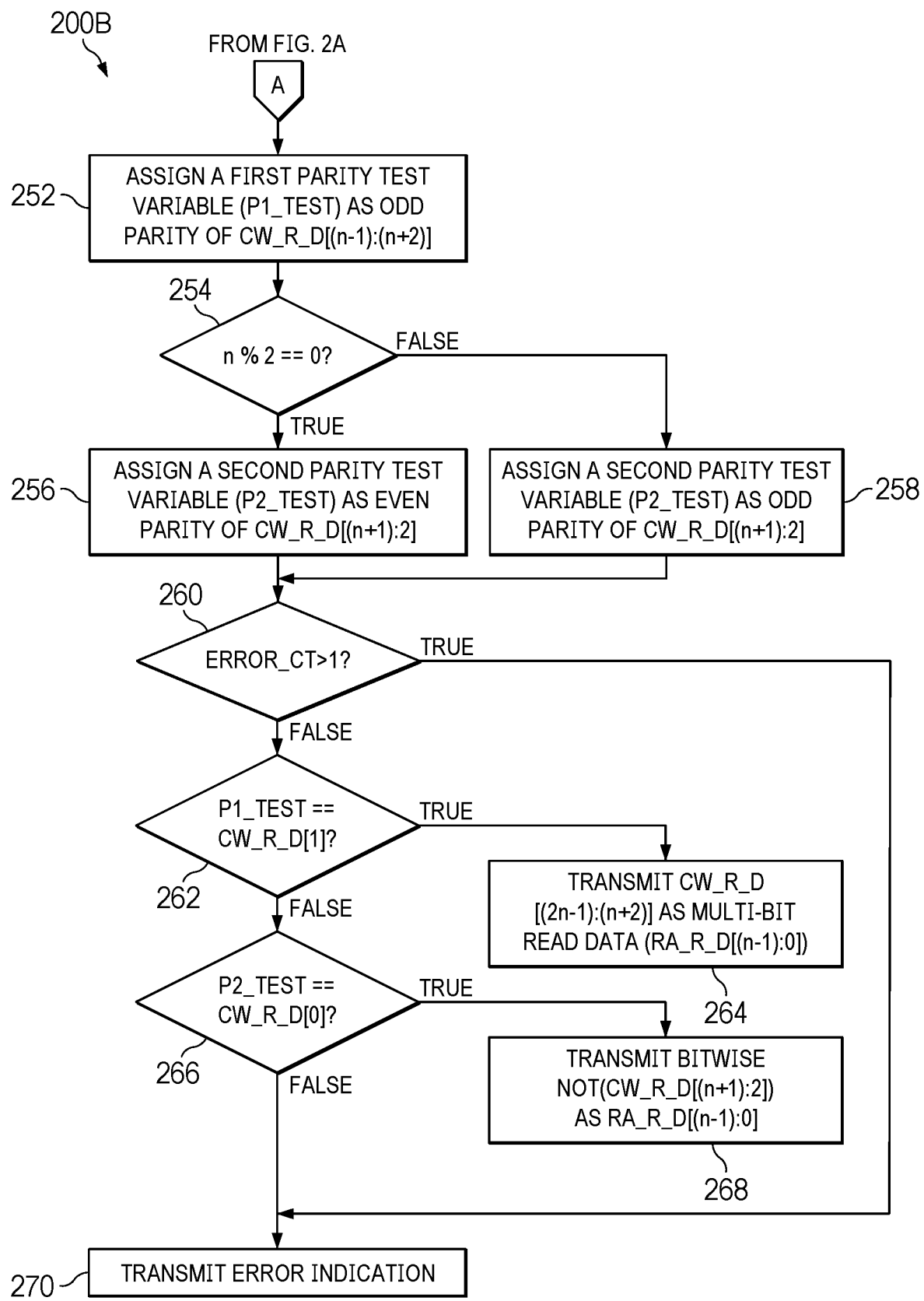

FIGS. 2A and 2B are flowcharts of a method 200A, 200B of extracting multi-bit data from a codeword read from memory according to some examples. The method 200A, 200B of FIGS. 2A and 2B assumes a format of a read codeword (CW_R_D) as indicated in Table 1, where the first subset of bit positions (CW_R_D[(2n+1):(n+2)]) corresponds to the original multi-bit data, the second subset of bit positions (CW_R_D[(n+1):2]) corresponds to a bitwise inversion of the original multi-bit data, the odd parity bit position (CW_R_D[1]) corresponds to an odd parity of the original multi-bit data, and the even parity bit position (CW_R_D[0]) corresponds to an even parity of the original multi-bit data. Other formats of a read codeword can be implemented, and modifications to the method 200A, 200B of FIGS. 2A and 2B based on such other formats would be apparent. The method 200A, 200B of FIGS. 2A and 2B may be performed by an encoder/decoder controller circuit, as detailed subsequently.

Referring to FIG. 2A, at block 202, a read codeword (CW_R_D[(2n+1):0]) read from memory is received. At block 203, a number of counted bit errors in the read codeword (CW_R_D[(2n+1):0]) is determined. The counted bit errors may include errors between bit values of the first subset of bit positions (CW_R_D[(2n+1):(n+2)]) and bit values of the second subset of bit positions (CW_R_D[(n+1):2]) and an error between a bit value of the odd parity bit position (CW_R_D[1]) and a bit value of the even parity bit position (CW_R_D[0]). With the format of the read codeword (CW_R_D[(2n+1):0]) being as described above, bit values of the second subset of bit positions (CW_R_D[(n+1):2]) should be logical inversion bit values of corresponding bit positions of the first subset of bit positions (CW_R_D[(2n+1):(n+2)]). Similarly, a bit values of the odd parity bit position (CW_R_D[1]) should be a logical inversion bit value of the even parity bit position (CW_R_D[0]). A bit error occurs where a bit value of a given bit position within the second subset equals (e.g., does not equal a logical inverse of) a bit value of a corresponding bit position within the first subset and where a bit value of the odd parity bit position (CW_R_D[1]) equals (e.g., does not equal a logical inverse of) a bit value of the even parity bit position (CW_R_D[0]).

As an example, in block 203 at block 204, a bit count variable (BIT_CT) and an error count variable (ERROR_CT) are initialized to zero. Blocks 206, 208, 210, 212 form an iterative loop to compare respective bit values of the first subset of bit positions (CW_R_D[(2n+1):(n+2)]) and the second subset of bit positions (CW_R_D[(n+1):2]) and increment the error count variable (ERROR_CT) on the condition that a bit error is identified. At block 206, a determination is made whether the bit count variable (BIT_CT) is less than or equal to (n−1). If, as determined at block 206, the bit count variable (BIT_CT) is less than or equal to (n−1), at block 208, a determination is made whether a bit value of CW_R_D[BIT_CT+2] is equal to a logical inversion of a bit value of CW_R_D[BIT_CT+n+2]. If, as determined at block 208, the bit value of CW_R_D[BIT_CT+2] is not equal to the logical inversion of the bit value of CW_R_D[BIT_CT+n+2], a bit error is identified, and at block 210, the error count variable (ERROR_CT) is incremented by one. If, as determined at block 208, the bit value of CW_R_D[BIT_CT+2] is equal to the logical inversion of the bit value of CW_R_D[BIT_CT+n+2], a bit error is not identified, and block 210 is omitted. At block 212, the bit count variable (BIT_CT) is incremented by one, and operation loops back to block 206. Once the determination at block 206 is that the bit count variable (BIT_CT) is greater than (n−1), the operation concludes the loop, indicating that the loop has traversed the bit positions of the first subset of bit positions (CW_R_D[(2n+1):(n+2)]) and the second subset of bit positions (CW_R_D[(n+1):2]). Then, at block 214, a determination is made whether a bit value of CW_R_D[1] is equal to a logical inversion of a bit value of CW_R_D[0]. If, as determined at block 214, the bit value of CW_R_D[1] is not equal to the logical inversion of the bit value of CW_R_D[0], a bit error is identified, and at block 216, the error count variable (ERROR_CT) is incremented by one. If, as determined at block 214, the bit value of CW_R_D[1] is equal to the logical inversion of the bit value of CW_R_D[0], a bit error is not identified, and block 216 is omitted.

In some instances, the counted bit errors may not include or indicate all bit errors in the read codeword (CW_R_D [(2n+1):0]). If, for example, bit values of corresponding bit positions in the first subset of bit positions (CW_R_D[(2n+1):(n+2)]) and the second subset of bit positions (CW_R_D [(n+1):2]) flip in opposing logical directions (e.g., a bit value of one bit position of the first subset flips from a logical one to a logical zero, and a bit value of a corresponding bit position of the second subset flips from a logical zero to a logical one), two bit errors have occurred, and the illustrated loop in FIG. 2A would not count these bit errors. Such bit flips in corresponding bit positions are believed to have a low likelihood of occurring. Further, parity checks, as described subsequently, may identify an error when such bit flips occur.

Following the determination of the number of counted bit errors in block 203, operation continues to FIG. 2B. At block 252, a first parity test variable (P1_TEST) is assigned the result of an odd parity of bit values of the first subset of bit positions (CW_R_D[(2n+1):(n+2)]). At block 254, a determination is made whether n is even (e.g., n % 2 or n mod 2 equals 0). On the condition that n is even as determined in block 254, at block 256, a second parity test variable (P2_TEST) is assigned the result of an even parity of bit values of the second subset of bit positions (CW_R_D[(n+1):2]). On the condition that n is not even (e.g., is odd) as determined in block 254, at block 258, a second parity test variable (P2_TEST) is assigned the result of an odd parity of bit values of the second subset of bit positions (CW_R_D [(n+1):2]).

At block 260, a determination is made whether the error count variable (ERROR_CT) (e.g., the number of counted bit errors) is greater than one. On the condition that the error count variable (ERROR_CT) (e.g., the number of counted bit errors) is not greater than one (e.g., is equal to or less than one) as determined at block 260, a determination is made whether the first parity test variable (P1_TEST) is equal to the bit value of the odd parity bit position (CW_R_D[1]). On the condition that the first parity test variable (P1_TEST) is equal to the bit value of the odd parity bit position (CW_R_D[1]) as determined at block 262 (and further, that the error count variable (ERROR_CT) is not greater than one as determined at block 260), the bit values of the first subset of bit positions (CW_R_D[(2n+1):(n+2)]) are transmitted as multi-bit read data (RA_R_D[(n−1):0]) at block 264.

On the condition that the first parity test variable (P1_TEST) is not equal to the bit value of the odd parity bit position (CW_R_D[1]) as determined at block 262 (and further, that the error count variable (ERROR_CT) is not greater than one as determined at block 260), at block 266, a determination is made whether the second parity test variable (P2_TEST) is equal to the bit value of the even parity bit position (CW_R_D[0]). On the condition that the second parity test variable (P2_TEST) is equal to the bit value of the even parity bit position (CW_R_D[0]) (and further, that the first parity test variable (P1_TEST) is not equal to the bit value of the odd parity bit position (CW_R_D[1]) as determined at block 262 and the error count variable (ERROR_CT) is not greater than one as determined at block 260), bitwise inverted values of the bit values of the second subset of bit positions (CW_R_D[(n+1):2]) are transmitted as multi-bit read data (RA_R_D[(n−1):0]) at block 268.

An error indication (e.g., an error flag) is transmitted at block 270 on the condition that (i) the error count variable (ERROR_CT) is greater than one as determined at block 260, or (ii) (a) the first parity test variable (P1_TEST) is not equal to the bit value of the odd parity bit position (CW_R_D[1]) as determined at block 262, and (b) the second parity test variable (P2 TEST) is equal to the bit value of the even parity bit position (CW_R_D[0]) as determined at block 266.

The logic of the method 200A, 200B of FIGS. 2A and 2B can be implemented by other flows of operations. For example, the bit count variable (BIT_CT), in the illustrated examples, may be assigned equal to n in block 204, where the bit count variable (BIT_CT) is decremented by one in block 212 and the determination at block 206 is whether the bit count variable (BIT_CT) is greater than or equal to 0. Further, determining whether the error count variable (ERROR_CT) is greater than one at block 260 can be performed after conclusion of block 203 and before blocks 252-258. In some examples, determining whether the error count variable (ERROR_CT) is greater than one at block 260 can be performed after incrementing the error count variable (ERROR_CT) in block 210 and before block 212 and/or after incrementing the error count variable (ERROR_CT) in block 216 and before block 252. In such instances, if the error count variable (ERROR_CT) is determined to be greater than one, an error indication can be transmitted like in block 270, thereby concluding the method 200A, 200B and omitting some operations. Additionally, various performances of blocks can be in parallel. Blocks 206-216 may be performed by parallel processing for example. In some examples, other logical statements and calculations can be implemented, such as where n is known at design, blocks 204-216 can be implemented by the statement ERROR_CT=(CW_R_D[2n+1]==CW_R_D[n+1])+ . . . + (CW_R_D[n+2]==CW_R_D[2])+(CW_R_D[1]== CW_R_D[0]).

Also, the conditional statement of block 254 may be omitted in some examples. If n is known to be even or odd at the time of system design, a system implementing the method 200A, 200B may omit the conditional statement of block 254 and one of blocks 256, 258 while implementing block 256 if n is known to be even or implementing block 258 if n is known to be odd. The incorporation of the conditional statement of block 254 may be for ease of describing a process flow without being overly redundant by describing multiple process flows.

Other modifications to logic statements and/or operations may be made. The type of parity may be switched in blocks 252, 256, 258 from odd parity to even parity, or vice versa, as appropriate. If the type of parity in blocks 252, 256, 258 is switched, the parity bit positions of the read codeword are also switched in blocks 262, 266 from the odd parity bit position (CW_R_D[1]) to the even parity bit position (CW_R_D[0]), or vice versa, as appropriate. Other logical inversions may be implemented to achieve equivalent logical operations.

Similar to what is shown in Table 3 above, in some specific examples, n is equal to four, such that the multi-bit read data (RA_R_D) has four bit positions and the read codeword (CW_R_D) has ten bit positions.

In many memory technologies, bit errors can occur due to many causes. Individual bit flips to zero may be a most likely occurrence for bit errors and can be caused by charge loss, partial radiation (e.g., ultraviolet (UV) or X-ray) erase, settling time violations, and stuck-at-zero events. Individual bit flips to one may have a low likelihood of occurrence and can be caused by a read-disturb event, a settling time violation, and a stuck-at-one event. Individual bit flips in both directions can have a low likelihood of occurrence and can be caused by settling time violations. The occurrence of all the bits flipping to zero can have a moderate likelihood and can be caused by radiation (e.g., UV or X-ray) erase, read voltage failure, and a reference current failure (high). The occurrence of all the bits flipping to one can also have a moderate likelihood and can be caused by a reference current failure (low).

Implementing the methods above can permit detection of errors caused by each of these types of bit errors. The methods can achieve Single Error Correction, Double Error Detection (SECDED) for bit values of a number n of bit positions of the multi-bit data for bidirectional errors (e.g., at least one bit flip to zero and one bit flip to one). A bidirectional error in the first and/or second subsets of bit positions may result in the number of counted bit errors being at least two, e.g., when the flips are not in corresponding bit positions, and hence, the method of FIGS. 2A and 2B would indicate an error, thereby detecting the error. A bidirectional error in the first and second subsets of bit positions in corresponding bit positions may result in parity errors, and hence, the method of FIGS. 2A and 2B would indicate an error, thereby detecting the error. The methods can achieve Single Error Correction, All Error Detection (SECAED) for unidirectional errors (e.g., all errors are either a bit flip to zero or a bit flip to one). For a single unidirectional error in a codeword, the data values of at least one of the first subset of bit positions and the second subset of bit positions are correct, and using the redundancy check by the odd parity values and the even parity values, the subset having the correct data values can be identified and extracted as the multi-bit data. For multiple unidirectional errors in a codeword, the bit error check coupled with the redundancy check by the parity values can permit detection of the errors, even if in some instances, the correct multi-bit data may not be extracted.

Further, a codeword implemented as described in the method above can, on average, have fewer bit values be a logical one. Having fewer bit values be a logical one reduces the instances in which the most likely bit error—individual bit flip to zero—may be possible. Hence, a worst case for data extraction may be improved.

Figure 3:
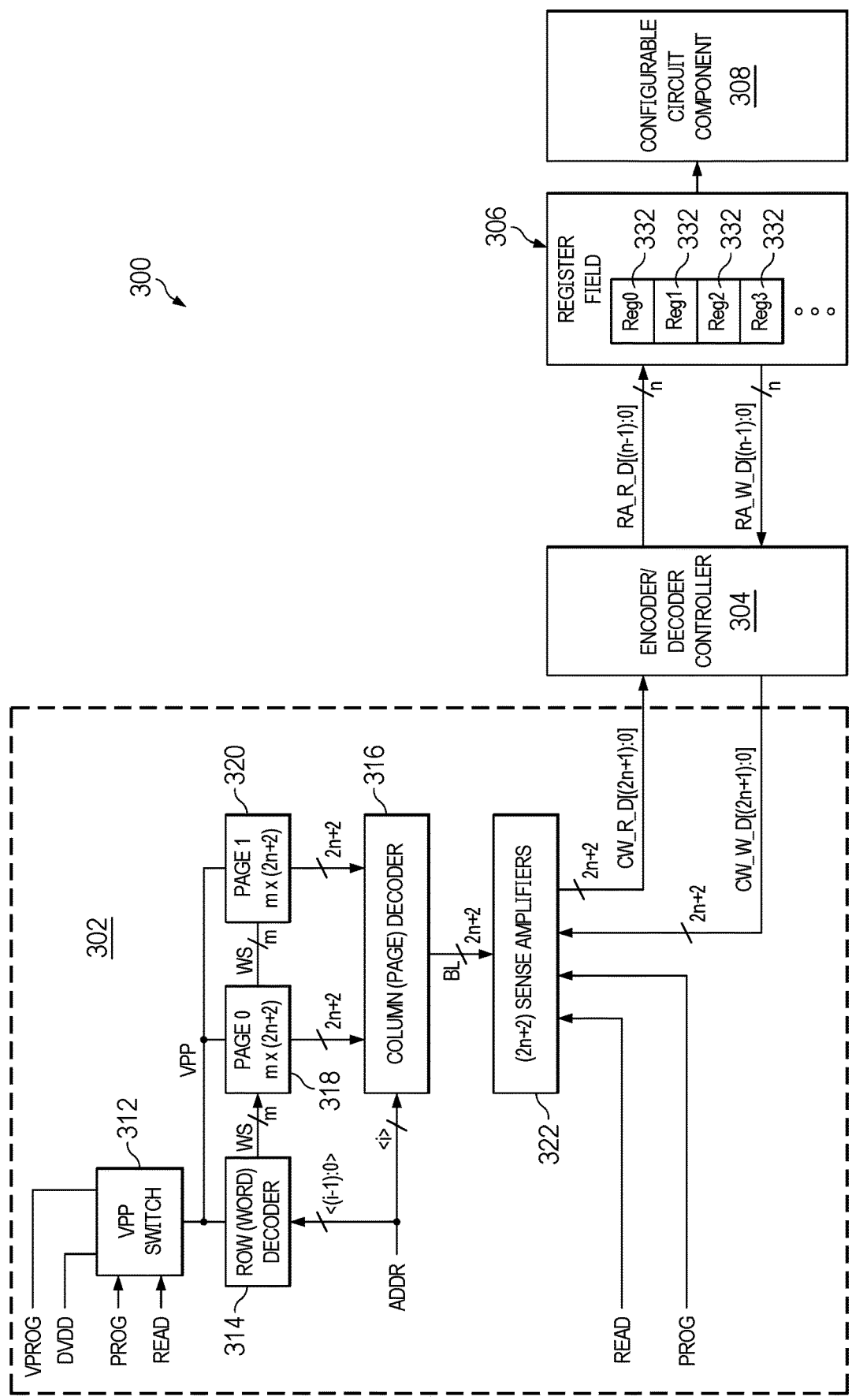
FIG. 3 is a circuit diagram of an integrated circuit (IC) according to some examples.

FIG. 3 is a circuit diagram of an integrated circuit (IC) 300 according to some examples. The IC 300 is merely an example architecture in which various methods described herein may be implemented. Other architectures may implement methods according to some examples. The IC 300 includes a memory system 302, an encoder/decoder controller circuit 304, a register field 306, and a configurable circuit component 308. The memory system 302 includes a supply or program voltage (VPP) switch circuit 312, a row decoder circuit 314, a column decoder circuit 316, a first memory page (Page 0) 318, a second memory page (Page 1) 320, and a sense amplifier circuit 322. The register field 306 includes registers 332. Additional memory page(s) may be implemented in other examples.

The encoder/decoder controller circuit 304 is communicatively coupled to the register field 306. As illustrated, n output bit nodes of the register field 306 are respectively communicatively coupled to n input bit nodes of the encoder/decoder controller circuit 304, and via these bit nodes, the encoder/decoder controller circuit 304 may receive raw multi-bit write data (RA_W_D[(n−1):0]) from the register field 306. Similarly, n output bit nodes of the encoder/decoder controller circuit 304 are respectively communicatively coupled to n input bit nodes of the register field 306, and via these bit nodes, the encoder/decoder controller circuit 304 may transmit multi-bit read data (RA_R_D[(n−1):0]) to the register field 306. The write or read multi-bit data may be stored in one or more registers 332 of the register field 306.

The register field 306 is further communicatively coupled to the configurable circuit component 308. The configurable circuit component 308 may receive multi-bit data stored in one or more registers 332 of the register field 306. The configurable circuit component 308 may be configured based on the multi-bit data received from the register field 306. The configurable circuit component 308 can be any type of configurable circuit or component thereof, such as a processor (e.g., where the multi-bit data is boot code), a power management circuit, or other analog or digital circuit.

The encoder/decoder controller circuit 304 is communicatively coupled to the memory system 302. As illustrated, (2n+2) number of output bit nodes of the encoder/decoder controller circuit 304 are respectively communicatively coupled to (2n+2) number of input bit nodes of the memory system 302 (e.g., the sense amplifier circuit 322), and via these bit nodes, the encoder/decoder controller circuit 304 may transmit a write codeword (CW_W_D[(2n+1):0]) to the memory system 302. Similarly, (2n+2) number of output bit nodes of the memory system 302 (e.g., the sense amplifier circuit 322) are respectively communicatively coupled to (2n+2) number of input bit nodes of the encoder/decoder controller circuit 304, and via these bit nodes, the encoder/decoder controller circuit 304 may receive a read codeword (CW_R_D[(2n+1):0]) from the memory system 302.

The encoder/decoder controller circuit 304 is configured to implement the method 100 of FIG. 1 and the method 200A, 200B of FIGS. 2A and 2B. The encoder/decoder controller circuit 304 can include one or more logic circuits, which may include any combinational logic and/or sequential logic, configured to implement these methods 100, 200A, 200B. The encoder/decoder controller circuit 304 is a physical circuit that may be implemented based on a synthesized register transfer level (RTL) description that implements the methods 100, 200A, 200B.

The memory system 302 is configured to write a write codeword (CW_W_D[(2n+1):0]) to and read a read codeword (CW_R_D[(2n+1):0]) from the first memory page 318 and/or second memory page 320. The first memory page 318 and second memory page 320 may implement any memory technology. In some examples, the first memory page 318 and second memory page 320 is non-volatile memory (NVM) and/or one-time programmable (OTP) read-only memory (ROM). Each of the first memory page 318 and second memory page 320 has m number of rows and (2n+2) number of columns of memory cells. Hence, each of the first memory page 318 and second memory page 320 has [m× (2n+2)] number of memory cells.

The VPP switch circuit 312 includes a logic circuit and a switch circuit. The VPP switch circuit 312 has input nodes electrically connected to a read and supply voltage (DVDD) node, a program voltage (VPROG) node, a program signal (PROG) node, and a read signal (READ) node. The VPP switch circuit 312 has an output node on which a supply or program voltage (VPP) is output. The logic circuit is configured to control a state of the switch circuit based on a program signal on the program signal (PROG) node and a read signal on the read signal (READ) node. The switch is controllable by the logic circuit to selectively output on the output node of the VPP switch circuit 312, as the VPP, a supply voltage received from the read and supply voltage (DVDD) node or a program voltage received from the program voltage (VPROG) node.

Various address bit nodes (ADDR) are electrically coupled to respective input nodes of the row decoder circuit 314 and the column decoder circuit 316. In the illustrated example, the most significant address bit node (ADDR<i>) is electrically coupled to an input node of the column decoder circuit 316, and the other address bit nodes (ADDRAi−1):0>) are electrically coupled to respective input nodes of the row decoder circuit 314. The row decoder circuit 314 includes a logic circuit configured to select a row of the first memory page 318 and a row of the second memory page 320 based on address signals received from the address bit nodes (ADDRAi−1):0>) to which the row decoder circuit 314 is electrically coupled. The row decoder circuit 314 has m number of word select (WS) output nodes electrically coupled to the first memory page 318 and second memory page 320 for selecting a row.

The column decoder circuit 316 includes a logic circuit configured to select a page (e.g., columns) of the first memory page 318 or the second memory page 320 based on an address signal received from the address bit node (ADDR<i>) to which the column decoder circuit 316 is electrically coupled. The column decoder circuit 316 has (2n+2) number of first input nodes electrically coupled to respective output nodes of the first memory page 318 and has (2n+2) number of second input nodes electrically coupled to respective output nodes of the second memory page 320. The column decoder circuit 316 has (2n+2) number of output nodes electrically coupled to respective input nodes of the sense amplifier circuit 322. The column decoder circuit 316 is configured to selectively electrically couple the first input nodes (that are electrically coupled to the first memory page 318) or the second input nodes (that are electrically coupled to the second memory page 320) to the respective input nodes of the sense amplifier circuit 322.

The sense amplifier circuit 322 includes a logic circuit, (2n+2) number of switch circuits, and (2n+2) number of sense amplifiers. The sense amplifier circuit 322 has, in addition to other input nodes previously described, input nodes electrically connected to the program signal (PROG) node and the read signal (READ) node. The logic circuit is configured to selectively electrically couple or de-couple, by controlling the (2n+2) number of switch circuits, the (2n+2) number of input nodes of the sense amplifier circuit 322 that are electrically coupled to the column decoder circuit 316 to or from the respective (2n+2) number of sense amplifiers based on the program signal on the program signal (PROG) node and the read signal on the read signal (READ) node. When the program signal indicates that a program (e.g., write) operation is to occur, the logic circuit causes the switches to electrically de-couple respective input nodes of the sense amplifiers from the input nodes of the sense amplifier circuit 322. When the read signal indicates that a read operation is to occur, the logic circuit causes the switches to electrically couple respective input nodes of the sense amplifiers to the input nodes of the sense amplifier circuit 322. The logic circuit is further configured to, when controlling the switch circuits to electrically de-couple the sense amplifiers, control the (2n+2) number of switch circuits to electrically couple or de-couple the (2n+2) number of input nodes of the sense amplifier circuit 322 that are electrically coupled to the column decoder circuit 316 to or from a ground node based on respective bit values of a write codeword (CW_W_D[(2n+1):0]) received from the encoder/decoder controller circuit 304. When the program signal indicates that a program (e.g., write) operation is to occur, the logic circuit causes the switches to electrically couple or de-couple respective input nodes of the sense amplifier circuit 322 to or from the ground node based on the write codeword.

In a write operation, the encoder/decoder controller circuit 304 generates a write codeword (CW_W_D[(2n+1):0]) and transmits the write codeword to the sense amplifier circuit 322. The program signal is also caused to indicate the occurrence of the write operation. The VPP switch circuit 312 outputs the program voltage on the program voltage (VPROG) node to the output node of the VPP switch circuit 312 as the VPP. The row decoder circuit 314 selects the row of the first memory page 318 or the row of the second memory page 320 based on the address signals on the address bit nodes (ADDR<(i−1):0>), and the column decoder circuit 316 selects the first memory page 318 or the second memory page 320 to be electrically coupled to the sense amplifier circuit 322. By operation of the row decoder circuit 314 and column decoder circuit 316, (2n+2) number of memory cells in a row in one of the first memory page 318 or the second memory page 320 are electrically coupled to the sense amplifier circuit 322. Further, the (2n+2) number of switch circuits electrically de-couple the sense amplifiers from the respective selected memory cells, and the (2n+2) number of switch circuits selectively electrically couple or de-couple the selective memory cells to the ground node based on respective bit values of the write codeword (CW_W_D[(2n+1):0]). Hence, for a given memory cell, an electrical loop or an open circuit can be created, as appropriate, to write a value to the given memory cell based on a corresponding bit value of the write codeword (CW_W_D [(2n+1):0]).

In a read operation, the read signal is caused to indicate the occurrence of the read operation. The VPP switch circuit 312 outputs the supply voltage on the read and supply voltage (DVDD) node to the output node of the VPP switch circuit 312 as the VPP. The row decoder circuit 314 selects the row of the first memory page 318 or the row of the second memory page 320 based on the address signals on the address bit nodes (ADDRAi−1):0>), and the column decoder circuit 316 selects the first memory page 318 or the second memory page 320 to be electrically coupled to the sense amplifier circuit 322. By operation of the row decoder circuit 314 and column decoder circuit 316, (2n+2) number of memory cells in a row in one of the first memory page 318 or the second memory page 320 are electrically coupled to the sense amplifier circuit 322. Further, the (2n+2) number of switch circuits electrically couple the (2n+2) number of sense amplifiers to the respective selected memory cells. The sense amplifiers sense and amplify the logical value stored in a corresponding memory cell and output respective bit values of the read codeword (CW_R_D[(2n+1):0]) to the encoder/decoder controller circuit 304. The encoder/decoder controller circuit 304 receives the read codeword (CW_R_D [(2n+1):0]) and extracts multi-bit data from the read codeword (CW_R_D[(2n+1):0]).

The encoder/decoder controller circuit 304 implementing the methods 100, 200A, 200B described above can permit architectural advantages. The number of bit values that are a logical one in a write codeword (CW_W_D[(2n+1):0]) is (n+1). Between the first subset and the second subset of bit positions, n bit values will be logical one, and between the odd and even parity bit positions, one bit value will be logical one. Because of this feature of the write codeword, the VPP switch circuit 312 can be designed for writing a codeword to provide write current for (n+1) number of logical ones. This can be an improvement over other approaches, even for smaller number of bit position codewords, since the number of logical ones is not random. If the number of logical ones was random, as with other approaches, the VPP switch circuit 312 may be designed to accommodate a possible occurrence in which all bit values of the codeword are a logical one. Hence, the size and footprint of the VPP switch circuit 312 may be reduced because the number of logical ones for a codeword in a worst case scenario may be reduced. Additionally, the programming current for writing a codeword can be constant, and hence, can be independent of the underlying data contained in the codeword, since any given codeword will have (n+1) logical one bit values. Similarly, assuming no bit errors in a codeword, a read current to read the codeword can be independent of the data. This can reduce or eliminate side channel attacks and can permit a single use case for design verification.

Although the encoder/decoder controller circuit 304 is described in the context of the IC 300, the encoder/decoder controller circuit 304 can be implemented as a stand-alone IC or with any other circuit. The IC 300 of FIG. 3 is provided merely as an example in which the encoder/decoder controller circuit 304 may be implemented.

Figure 4:
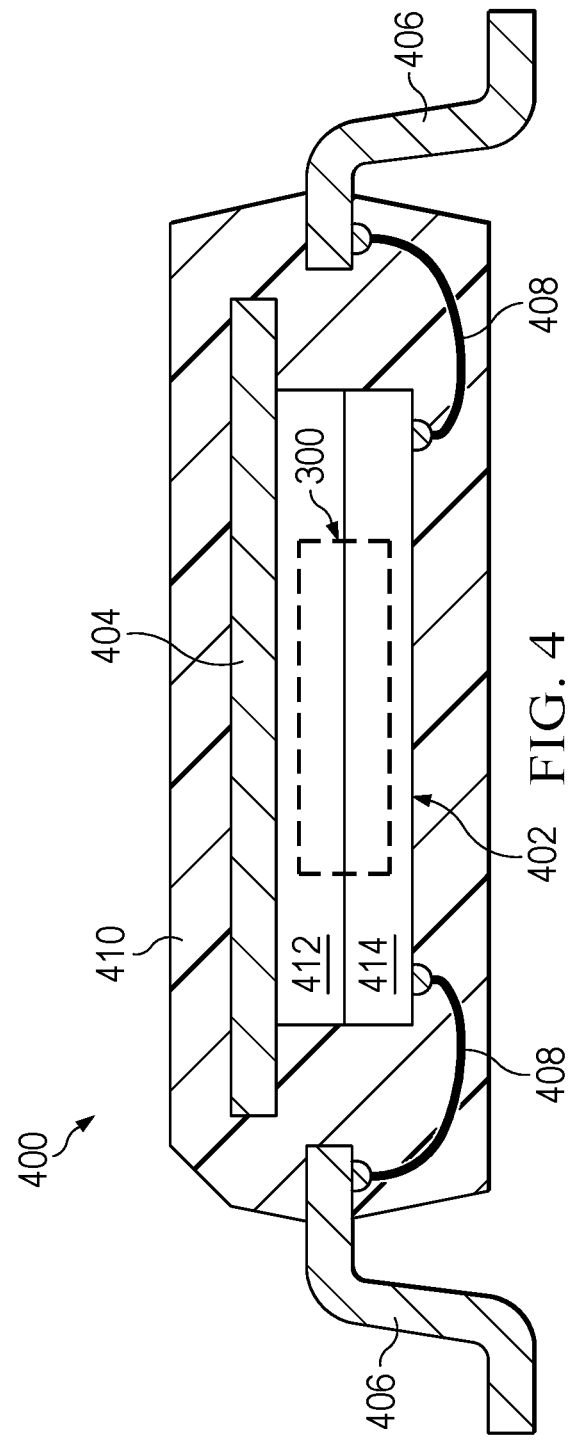
FIG. 4 is a cross-sectional view of an IC package according to some examples.

FIG. 4 is a cross-sectional view of an IC package 400 according to some examples. An IC die 402 that includes the IC 300 of FIG. 3 is packaged in the IC package 400. The IC package 400 also includes a leadframe 404 with leads 406. The IC die 402 is mechanically attached (e.g., by an adhesive) to the leadframe 404. Wires 408 are bonded between the IC die 402 and the leads 406. Hence, functional circuits on the IC die 402 may be electrically connected externally via the leads 406 and wires 408. The IC die 402 and leadframe 404 are encapsulated with an encapsulant 410, such as a molding compound. Other examples of an IC package include a quad flat no lead (QFN) package, a ball grid array (BGA) package, a single inline package (SIP), a dual inline package (DIP), a wafer-level chip-scale package (WCSP), or another IC package.

The IC die 402 includes a semiconductor substrate 412 and an interconnect structure 414 on or over the semiconductor substrate 412. For clarity, components of the IC die 402 may be described with the IC die 402 in a face up orientation, although the IC die 402 is illustrated in a face down orientation. The semiconductor substrate 412 can be or include a bulk semiconductor substrate, a semiconductor-on-insulator (SOI) substrate, or any other appropriate substrate, and in some cases, may include one or more epitaxial layer epitaxially grown on an underlying substrate. In some examples, the semiconductor substrate 412 is or includes a bulk silicon substrate, which may further include one or more silicon epitaxial layers epitaxially grown on the bulk silicon substrate. The interconnect structure 414 can include one or more dielectric layers, such as pre-metal dielectric (PMD) and inter-layer dielectric (ILD) layers, disposed on or over the semiconductor substrate 412. The interconnect structure 414 can further include one or more metal levels, with each metal level including metal lines and/or metal pads, on, over, and/or embedded in respective dielectric layers. Metal vias may be disposed through respective dielectric layers interconnecting different metal levels. Various devices (e.g., transistors) can be formed in, on, and/or over the semiconductor substrate 412 and interconnected via the interconnect structure 414 to form the IC 300.

Figure 5:
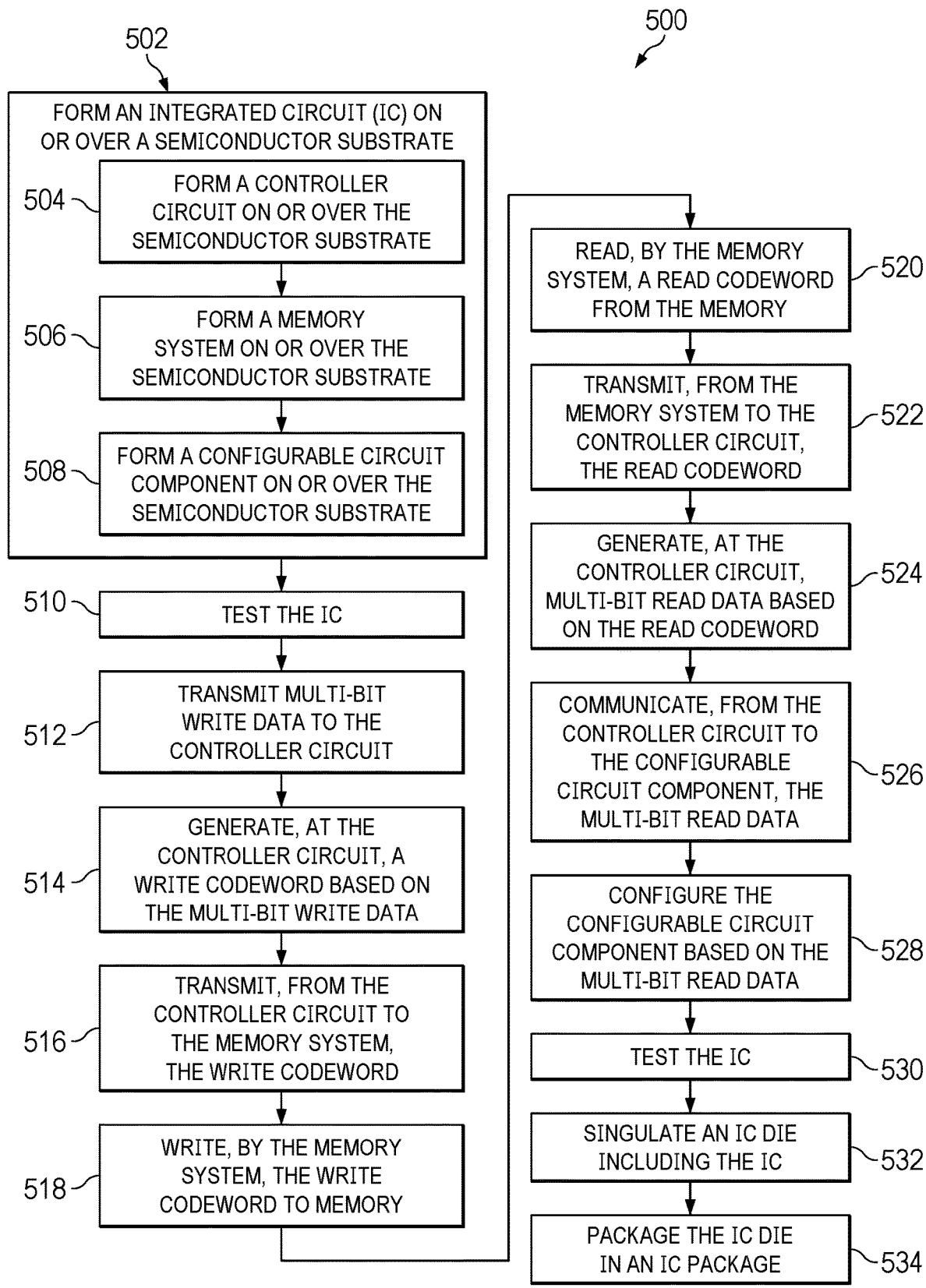
FIG. 5 is a flowchart of a method of manufacturing an IC package according to some examples.

FIG. 5 is a flowchart of a method 500 of manufacturing an IC package according to some examples. At block 502, an IC 300 is formed on or over a semiconductor substrate 412. Forming the IC 300 at block 502 includes forming an encoder/decoder controller circuit 304 on or over the semiconductor substrate 412 at block 504; forming a memory system 302 on or over the semiconductor substrate 412 at block 506; and forming a configurable circuit component 308 on or over the semiconductor substrate 412 at block 508. The processing of block 502 can be by any appropriate processing and may be performed on a semiconductor substrate (e.g., a wafer) that includes multiple IC die areas on which respective ICs are formed.

At block 510, the IC 300 is again tested. For example, the configurable circuit component 308 can be tested for functionality based on manufacturing. The testing can be by probing external pads of the IC 300 with a test probe, applying test signals via the external pads and test probe, and sensing test responses via the external pads and test probe.

At block 512, multi-bit write data is transmitted to the encoder/decoder controller circuit 304. The multi-bit data is data that is to be written to memory and is generated based on the testing of block 510. The multi-bit data may be used to configure the configurable circuit component 308 to compensate for, e.g., variations in manufacturing observed via testing of the configurable circuit component 308 at block 510. At block 514, the encoder/decoder controller circuit 304 generates a write codeword based on the multi-bit write data, as described with respect to the method 100 of FIG. 1. At block 516, the write codeword is transmitted from the encoder/decoder controller circuit 304 to the memory system 302, and at block 518, the write codeword is written to memory by the memory system 302. The operations of blocks 512-518 may be performed while the test probe contacts external pads of the IC 300 and supplies appropriate power, program voltage, data, and signals.

At block 520, a read codeword is read from memory by the memory system 302, and at block 522, the read codeword is transmitted from the memory system 302 to the encoder/decoder controller circuit 304. At block 524, the encoder/decoder controller circuit 304 generates multi-bit read data based on the read codeword, like described above in method 200A, 200B of FIGS. 2A and 2B. At block 526, the multi-bit read data is communicated from the encoder/decoder controller circuit 304 to the configurable circuit component 308 (e.g., via the register field 306), and at block 528, the configurable circuit component 308 is configured based on the multi-bit read data. The multi-bit read data can be transmitted to the configurable circuit component 308 and the configurable circuit component 308 may be configured by storing the multi-bit read data in an appropriate one or more registers 332 of the register field 306. Like above, the operations of blocks 520-528 may be performed while the test probe probes external contacts of the IC 300 and supplies appropriate power and signals.

At block 530, the IC 300 is tested. For example, the configurable circuit component 308 can be tested for functionality as configured at block 528. The testing can be by probing external pads of the IC 300 with a test probe, applying test signals via the external pads and test probe, and sensing test responses via the external pads and test probe. At block 532, on the condition that the functionality of the IC 300 is acceptable based on the testing at block 530, the IC die 402 including the IC 300 is singulated from other IC dies formed on the semiconductor substrate. The singulation may be by sawing, dicing, or the like. At block 534, the IC die 402 is packaged in an IC package 400 (or other IC package) using appropriate processes.

Although various examples have been described in detail, it should be understood that various changes, substitutions, and alterations can be made therein without departing from the scope defined by the appended claims.

What is claimed is:

1. An integrated circuit comprising:
  a memory system comprising memory; and
  a controller circuit comprising one or more logic circuits, the controller circuit being communicatively coupled to the memory system, the controller circuit being configured to:
    receive multi-bit data to be written to the memory;
    generate a codeword based on the multi-bit data, the codeword having a format including first bit positions for the multi-bit data, second bit positions for a bitwise inversion of the multi-bit data, a third bit position for an odd parity value, and a fourth bit position for an even parity value, the odd parity value indicating an odd parity of the multi-bit data, the even parity value indicating an even parity of the multi-bit data; and
    transmit to the memory system the codeword for writing to the memory.

2. The integrated circuit of claim 1, wherein the format includes the first bit positions concatenated with the second bit positions.

3. The integrated circuit of claim 1, wherein the first bit positions in the format and the second bit positions in the format are a same even number of bit positions.

4. The integrated circuit of claim 1, wherein the multi-bit data is in four bit positions, and the format of the codeword is ten bit positions.

5. An integrated circuit comprising:
  a memory system comprising memory; and
  a controller circuit comprising one or more logic circuits, the controller circuit being communicatively coupled to the memory system, the controller circuit being configured to:
    receive from the memory system a codeword read from the memory, the codeword having a format including first bit positions corresponding to multi-bit data, second bit positions corresponding to a bitwise inversion of the multi-bit data, a third bit position corresponding to a first parity value of the multi-bit data, and a fourth bit position corresponding to a second parity value of the multi-bit data, wherein the first parity value is one of an even parity value or an odd parity value, and the second parity value is the other of the even parity value or the odd parity value;
    determine a number of counted bit errors in the codeword, a counted bit error including a bit value of a bit position of the first bit positions and a bit value of a corresponding bit position of the second bit positions having an equal value and including a bit value of the third bit position and a bit value of the fourth bit position having an equal value;
    determine a third parity value of bit values of the first bit positions, the third parity value being a same parity type as the first parity value;
    determine a fourth parity value of bit values of the second bit positions;
    transmit the bit values of the first bit positions as the multi-bit data read from the memory on the condition that (i) the number of counted bit errors is equal to or less than one and (ii) the third parity value is equal to a bit value of the third bit position; and
    transmit a bitwise inversion of the bit values of the second bit positions as the multi-bit data read from the memory on the condition that (i) the number of counted bit errors is equal to or less than one, (ii) the third parity value is not equal to the bit value of the third bit position, and (iii) the fourth parity value is equal to a bit value of the fourth bit position.

6. The integrated circuit of claim 5, wherein the format includes the first bit positions concatenated with the second bit positions.

7. The integrated circuit of claim 5, wherein the first bit positions in the format and the second bit positions in the format are a same even number of bit positions.

8. The integrated circuit of claim 7, wherein:
  the first parity value and the third parity value are both an odd parity value; and
  the second parity value and the fourth parity value are both an even parity value.

9. The integrated circuit of claim 7, wherein:
  the first parity value and the third parity value are both an even parity value; and
  the second parity value and the fourth parity value are both an odd parity value.

10. The integrated circuit of claim 5, wherein the first bit positions in the format and the second bit positions in the format are a same odd number of bit positions.

11. The integrated circuit of claim 10, wherein:
  the first parity value, the third parity value, and the fourth parity value are each an odd parity value; and
  the second parity value is an even parity value.

12. The integrated circuit of claim 10, wherein:
  the first parity value, the third parity value, and the fourth parity value are each an even parity value; and
  the second parity value is an odd parity value.

13. The integrated circuit of claim 5, wherein the multi-bit data is in four bit positions, and the format is ten bit positions.

14. The integrated circuit of claim 5, wherein the controller circuit is further configured to transmit an error indication on the condition that (i) the number of counted bit errors is greater than one, or (ii) (a) the third parity value is not equal to the bit value of the third bit position, and (b) the fourth parity value is not equal to the bit value of the fourth bit position.

15. The integrated circuit of claim 5, wherein the controller circuit is further configured to determine the number of counted bit errors, including
  initialize an bit error count to zero;
  iteratively increment, for a number of the first bit positions, the bit error count on the condition that a bit value of a respective bit position of the first bit positions equals a bit value of a corresponding bit position of the second bit positions; and increment the bit error count on the condition that the bit value of the third bit position equals the bit value of the fourth bit position.

16. A method of manufacturing an integrated circuit (IC), the method comprising:
forming a memory system on or over a semiconductor substrate, the memory system comprising memory; and
forming a controller circuit on or over the semiconductor substrate, the controller circuit comprising one or more logic circuits, the controller circuit being communicatively coupled to the memory system, the controller circuit being configured to:
receive multi-bit data to be written to the memory;
generate a codeword based on the multi-bit data, the codeword having a format including first bit positions for the multi-bit data, second bit positions for a bitwise inversion of the multi-bit data, a third bit position for an odd parity value, and a fourth bit position for an even parity value, the odd parity value indicating an odd parity of the multi-bit data, the even parity value indicating an even parity of the multi-bit data; and
transmit to the memory system the codeword for writing to the memory.

17. The method of claim 16, wherein the first bit positions in the format and the second bit positions in the format are a same even number of bit positions.

18. The method of claim 16 further comprising:
transmitting, to the controller circuit, first multi-bit data to be written to the memory;
transmitting, from the controller circuit to the memory system, a first codeword including the first multi-bit data to be written; and
writing the first codeword to the memory.

19. The method of claim 18 further comprising:
receiving, at the controller circuit, the first multi-bit data to be written to the memory; and
generating, at the controller circuit, the first codeword having the format and based on the first multi-bit data.

20. The method of claim 18 further comprising:
before transmitting the first multi-bit data to be written, testing a circuit component disposed on or over the semiconductor substrate; and
after writing the first codeword to the memory, testing the circuit component, the circuit component being configured by the first multi-bit data included in the first codeword.

21. The method of claim 16 further comprising:
singulating an IC die including the memory system and the controller circuit; and
packaging the IC die in an IC package.

22. A method of manufacturing an integrated circuit, the method comprising:
forming a memory system on or over a semiconductor substrate, the memory system comprising memory; and
forming a controller circuit on or over the semiconductor substrate, the controller circuit comprising one or more logic circuits, the controller circuit being communicatively coupled to the memory system, the controller circuit being configured to:
receive from the memory system a codeword read from the memory, the codeword having a format including first bit positions corresponding to multi-bit data, second bit positions corresponding to a bitwise inversion of the multi-bit data, a third bit position corresponding to a first parity value of the multi-bit data, and a fourth bit position corresponding to a second parity value of the multi-bit data, wherein the first parity value is one of an even parity value or an odd parity value, and the second parity value is the other of the even parity value or the odd parity value;
determine a number of counted bit errors in the codeword, a counted bit error including a bit value of a bit position of the first bit positions and a bit value of a corresponding bit position of the second bit positions having an equal value and including a bit value of the third bit position and a bit value of the fourth bit position having an equal value;
determine a third parity value of bit values of the first bit positions, the third parity value being a same parity type as the first parity value;
determine a fourth parity value of bit values of the second bit positions;
transmit the bit values of the first bit positions as the multi-bit data read from the memory on the condition that (i) the number of counted bit errors is equal to or less than one and (ii) the third parity value is equal to a bit value of the third bit position; and
transmit a bitwise inversion of the bit values of the second bit positions as the multi-bit data read from the memory on the condition that (i) the number of counted bit errors is equal to or less than one, (ii) the third parity value is not equal to the bit value of the third bit position, and (iii) the fourth parity value is equal to a bit value of the fourth bit position.

23. The method of claim 22, wherein the first bit positions in the format and the second bit positions in the format are a same even number of bit positions.

24. The method of claim 23, wherein:
the first parity value and the third parity value are both an odd parity value; and
the second parity value and the fourth parity value are both an even parity value.

25. The method of claim 23, wherein:
the first parity value and the third parity value are both an even parity value; and
the second parity value and the fourth parity value are both an odd parity value.

26. The method of claim 22, wherein the first bit positions in the format and the second bit positions in the format are a same odd number of bit positions.

27. The method of claim 26, wherein:
the first parity value, the third parity value, and fourth parity value are each an odd parity value; and
the second parity value is an even parity value.

28. The method of claim 26, wherein:
the first parity value, the third parity value, and fourth parity value are each an even parity value; and
the second parity value is an odd parity value.

29. The method of claim 22, wherein the controller circuit is further configured to transmit an error indication on the condition that (i) the number of counted bit errors is greater than one, or (ii) (a) the third parity value is not equal to the bit value of the third bit position, and (b) the fourth parity value is not equal to the bit value of the fourth bit position.

30. The method of claim 22, wherein the controller circuit is further configured to determine the number of counted bit errors including:
initialize an bit error count to zero;
iteratively increment, for a number of the first bit positions, the bit error count on the condition that a bit value of a respective bit position of the first bit positions equals a bit value of a corresponding bit position of the second bit positions; and increment the bit error count on the condition that the bit value of the third bit position equals the bit value of the fourth bit position.

31. The method of claim 22 further comprising:

transmitting, to the controller circuit, first multi-bit data to be written to the memory;

transmitting, from the controller circuit to the memory system, a first codeword including the first multi-bit data to be written; and writing the first codeword to the memory.

32. The method of claim 31 further comprising:

before transmitting the first multi-bit data to be written, testing a circuit component disposed on or over the semiconductor substrate;

reading the first codeword from the memory;

transmitting, from the memory system to the controller circuit, the first codeword;

generating, by the controller circuit, the first multi-bit data from the first codeword;

transmitting, from the controller circuit, the generated first multi-bit data, the circuit component being configured by the generated first multi-bit data; and after transmitting the generated first multi-bit data, testing the circuit component.

33. The method of claim 22 further comprising:

singulating an IC die including the memory system and the controller circuit; and packaging the IC die in an IC package.

\* \* \* \* \*